(12) United States Patent
Zaiss et al.

(10) Patent No.: US 11,965,946 B2
(45) Date of Patent: Apr. 23, 2024

(54) MACHINE LEARNING BASED PROCESSING OF MAGNETIC RESONANCE DATA, INCLUDING AN UNCERTAINTY QUANTIFICATION

(71) Applicant: Max-Planck-Gesellschaft zur Foerderung der Wissenschaften e. V., Munich (DE)

(72) Inventors: Moritz Zaiss, Erlangen (DE); Felix Glang, Tuebingen (DE); Sergey Prokudin, Tuebingen (DE); Klaus Scheffler, Tuebingen (DE)

(73) Assignee: Max-Planck-Gesellschaft zur Foerderung der Wissenschaften e. V., Munich (DE)

( * ) Notice: Subject to any disclaimer, the term of this patent is extended or adjusted under 35 U.S.C. 154(b) by 532 days.

(21) Appl. No.: 17/111,545

(22) Filed: Dec. 4, 2020

(65) Prior Publication Data
US 2022/0179026 A1    Jun. 9, 2022

(51) Int. Cl.
*G01R 33/56* (2006.01)
*G01R 33/565* (2006.01)
*G06T 7/00* (2017.01)

(52) U.S. Cl.
CPC ... *G01R 33/5608* (2013.01); *G01R 33/56563* (2013.01); *G06T 7/0012* (2013.01); *G06T 2207/10088* (2013.01); *G06T 2207/20081* (2013.01); *G06T 2207/20084* (2013.01)

(58) Field of Classification Search
None
See application file for complete search history.

(56) References Cited

U.S. PATENT DOCUMENTS

2017/0160363 A1    6/2017  Chen et al.

FOREIGN PATENT DOCUMENTS

WO    2010023132 A1    3/2010
WO    2017192629 A1    11/2017

OTHER PUBLICATIONS

Knoll, Florian, et al. "Assessment of the generalization of learned image reconstruction and the potential for transfer learning." Magnetic resonance in medicine 81.1 (2019): 116-128. (Year: 2019).*

(Continued)

*Primary Examiner* — Samah A Beg
(74) *Attorney, Agent, or Firm* — Caesar Rivise, PC

(57) ABSTRACT

A method of processing magnetic resonance data of a sample under investigation includes the steps of provision of the MR data being collected with an MRI scanner apparatus, and machine learning based data analysis of the MR data by supplying the MR data to an artificial neural network being trained with predetermined training data, wherein at least one image parameter of the sample and additionally at least one uncertainty quantification measure representing a prediction error of the at least one image parameter are provided by output elements of the neural network. Furthermore, a magnetic resonance imaging (MRI) scanner apparatus being adapted for employing the method of processing MR data is described.

14 Claims, 8 Drawing Sheets

(56) References Cited

OTHER PUBLICATIONS

Tanno et al. "Bayesian image quality transfer with CNNs: exploring uncertainty in dMRI super-resolution." MICCAI 2017: 20th International Conference, Quebec City, QC, Canada, Sep. 11-13, 2017, Proceedings, Part I 20. Springer International Publishing, 2017. (Year: 2017).*
Zhang, Zizhao, et al. "Reducing uncertainty in undersampled MRI reconstruction with active acquisition." Proceedings of the IEEE/CVF Conference on Computer Vision and Pattern Recognition. 2019. (Year: 2019).*
Abadi et al. (2016). TensorFlow: A System for Large-Scale Machine Learning. In Proceedings of the 12th USENIX Symposium on Operating Systems Design and Implementation, 265-283.
Bertleff et al. (2017). Diffusion parameter mapping with the combined intravoxel incoherent motion and kurtosis model using artificial neural networks at 3 T. NMR in Biomedicine, 1-11.
Bishop et al. (1992).Fast curve fitting using neural networks. Rev Sci Instrum. 63(10), 4450-4456.
Bragman et al. (2018). Uncertainty in multitask learning: joint representations for probabilistic MR-only radiotherapy planning. In: Frangi AF, Schnabel JA, Davatzikos C, Alberola-López C, Fichtinger G, editors. Medical image computing and computer assisted intervention—MICCAI 2018. Lecture notes in computer science. Cham: Springer, 3-11.
Breitling et al. (2019). Adaptive denoising for chemical exchange saturation transfer MR imaging. NMR in Biomedicine, 1-14.
Cai et al. (2012). Magnetic resonance imaging of glutamate. Nature Medicine, 18(2), 302-306.
Chappell et al. (2013). Quantitative Bayesian model-based analysis of amide proton transfer MRI. Magnetic Resonance Medicine, 70, 556-567.
Chollet et al. (2015). Screenshot of webpage from https://github.com/fchollet/keras captured on Mar. 12, 2021.
Cohen et al. (2018). MR fingerprinting deep reconstruction network (DRONE). Magnetic Resonance Medicine, 80, 885-894.
Cohen et al. (2018). Rapid and quantitative chemical exchange saturation transfer (CEST) imaging with magnetic resonance fingerprinting (MRF). Magnetic Resonance Medicine, 2449-2463.
Cox et al. (1997). Software tools for analysis and visualization of fMRI data. NMR Biomed., 10, 171-178.
Deshmane et al. (2019). 3D gradient echo snapshot CEST MRI with low power saturation for human studies at 3T. Magnetic Resonance Medicine, 81, 2412-2423.
Domsch et al. (2018). Oxygen extraction fraction mapping at 3 Tesla using an artificial neural network: a feasibility study. Magnetic Resonance Medicine, 79, 890-899.
Gal et al. (2016). Dropout as a Bayesian approximation: representing model uncertainty in deep learning. In Proceedings of the 33rd International Conference on International Conference on Machine Learning, 48, 1050-1059.
Gal et al. (2017). Deep Bayesian active learning with image data. In Proceedings of the 34th International Conference on Machine Learning, 70, 1183-1192.
Gast et al. (2018). Lightweight probabilistic deep networks. In Proceedings of the 2018 IEEE/CVF Conference on Computer Vision and Pattern Recognition, 3369-3378.
Goerke et al. (2019). Relaxation—compensated APT and rNOE CEST-MRI of human brain tumors at 3 T. Magnetic Resonance Medicine, 1-11.
Heo et al. (2016). Quantitative assessment of amide proton transfer (APT) and nuclear overhauser enhancement (NOE) imaging with extrapolated semi-solid magnetization transfer reference (EMR) signals: application to a rat glioma model at 4.7 Tesla. Magnetic Resonance Medicine, 75, 137-149.
Heo et al. (2016). Quantitative assessment of amide proton transfer (APT) and nuclear overhauser enhancement (NOE) imaging with extrapolated semisolid magnetization transfer reference (EMR) signals: II. Comparison of three EMR models and application to human brain glioma at 3 Tesla. Magnetic Resonance Medicine, 75, 1630-1639.
Kendall et al. (2017). What uncertainties do we need in Bayesian deep learning for computer vision? In Proceeings of the 31st International Conference on Neural Information Processing Systems.
Kingma et al. (2015). Adam: a method for stochastic optimization, Published as a conference paper at ICLR, 1-15.
Kogan et al. (2014). Method for high-resolution imaging of creatine in vivo using chemical exchange saturation transfer. Magnetic Resonance Medicine, 71, 164-172.
Kujawa et al. (2019). Assessment of a clinically feasible Bayesian fitting algorithm using a simplified description of chemical exchange saturation transfer (CEST) imaging. J Magn Reson., 300, 120-134.
Lecun et al. (2015). Deep learning. Nature, 521, 436-444.
Liu et al. (2013). Quantitative characterization of nuclear overhauser enhancement and amide proton transfer effects in the human brain at 7 Tesla. Magnetic Resonance Medicine, 70, 1070-1081.
Liu et al. (2019). 150× acceleration of myelin water imaging data analysis by a neural network, Program No. 0152. In: Proceedings of ISMRM 27th Annual Meeting, 1-3.
Morrison et al. (1995). A model for magnetization transfer in tissues. Magn Reson Med. 33, 475-482.
Nair et al. (2018). Exploring uncertainty measures in deep networks for multiple sclerosis lesion detection and segmentation. In: Frangi AF, Schnabel JA, Davatzikos C, Alberola López C, Fichtinger G, editors. Medical image computing and computer assisted intervention—MICCAI 2018. Lecture notes in computer science. Cham: Springer, 655-663.
Nix et al. (1994). Estimating the mean and variance of the target probability distribution. In: Proceedings of 1994 IEEE International Conference on Neural Networks (ICNN'94), 1, 55-60.
Prokudin et al. (2018). Deep directional statistics: pose estimation with uncertainty quantification. In: Ferrari V, Hebert M, Sminchisescu C, Weiss Y, eds. Computer vision—ECCV 2018. Vol. 11213. Cham: Springer, 542-559.
Schmidhuber. (2015). Deep learning in neural networks: an overview. Neural Networks, 61, 85-117.
Ward et al. (2000). Determination of pH using water protons and chemical exchange dependent saturation transfer (CEST). Magnetic Resonance Medicine, 44, 799-802.
Windschuh et al. (2015). Correction of B1-inhomogeneities for relaxation-compensated CEST imaging at 7 T. NMR Biomed., 28, 529-537.
Zaiss et al. (2015). Relaxation—compensated CEST-MRI of the human brain at 7T: unbiased insight into NOE and amide signal changes in human glioblastoma. NeuroImage, 112, 180-188.
Zaiss et al. (2017). Downfield-NOE-suppressed amide-CEST-MRI at 7 Tesla provides a unique contrast in human glioblastoma. Magnetic Resonance Medicine, 77, 196-208.
Zaiss et al. (2018). Chemical exchange saturation transfer MRI contrast in the human brain at 9.4 T. NeuroImage, 179, 144-155.
Zaiss et al. (2018). Snapshot-CEST: optimizing spiral-centric-reordered gradient echo acquisition for fast and robust 3D CEST MRI at 9.4 T. NMR Biomed., 1-14.
Zaiss et al. (2019). DeepCEST: 9.4 T chemical exchange saturation transfer MRI contrast predicted from 3 T data—a proof of concept study. Magnetic Resonance in Medicine, 81, 3901-3914.
Zaiss et al. (2019). Possible artifacts in dynamic CEST MRI due to motion and field alterations. J Magn Reson., 298, 16-22.
Zhou et al. (2003). Using the amide proton signals of intracellular proteins and peptides to detect pH effects in MRI. Nat Med., 9(8), 1085-1090.
Zhou et al. (2017). Quantitative chemical exchange saturation transfer (CEST) MRI of glioma using image downsampling expedited adaptive least-squares (IDEAL) fitting. Scientific Reports, 7(84), 1-10.
Glang et al. "DeepCEST 3T: Robust MRI parameter determination and uncertainty quantification with neural networks—application to

(56) References Cited

OTHER PUBLICATIONS

CEST imaging of the human brain at 3T." Magnetic resonance in medicine 84, No. 1 (2020): 450-466.

\* cited by examiner

MACHINE LEARNING BASED PROCESSING OF MAGNETIC RESONANCE DATA, INCLUDING AN UNCERTAINTY QUANTIFICATION

FIELD OF THE INVENTION

The invention relates to a method and to an apparatus for processing magnetic resonance (MR) data of a sample under investigation, e. g. a biological organism, like a patient or a test person, or a part thereof, or a material sample to be investigated. Preferably, the processing of MR data is included in a magnetic resonance tomography (MRT) procedure for investigating the sample under investigation. Applications of the invention are available e. g. in the fields of medical imaging or material investigations.

TECHNICAL BACKGROUND

In the present specification, reference is made to the following prior art illustrating technical background of the invention and related techniques:

[1] Zaiss M, Windschuh J, Paech D, et al. Relaxation-compensated CEST-MRI of the human brain at 7T: unbiased insight into NOE and amide signal changes in human glioblastoma. NeuroImage. 2015; 112:180-188;

[2] Windschuh J, Zaiss M, Meissner J E, et al. Correction of B1-inhomogeneities for relaxation-compensated CEST imaging at 7 T. NMR Biomed. 2015; 28:529-537;

[3] Liu D, Zhou J, Xue R, Zuo Z, An J, Wang D J J. Quantitative characterization of nuclear overhauser enhancement and amide proton transfer effects in the human brain at 7 Tesla. Magn Reson Med. 2013; 70:1070-1081;

[4] Chappell M A, Donahue M J, Tee Y K, et al. Quantitative Bayesian model-based analysis of amide proton transfer MRI. Magn Reson Med. 2013; 70:556-567;

[5] Kujawa A, Kim M, Demetriou E, et al. Assessment of a clinically feasible Bayesian fitting algorithm using a simplified description of chemical exchange saturation transfer (CEST) imaging. J Magn Reson. 2019; 300:120-134;

[6] Heo H Y, Zhang Y, Lee D H, Hong X, Zhou J. Quantitative assessment of amide proton transfer (APT) and nuclear overhauser enhancement (NOE) imaging with extrapolated semi-solid magnetization transfer reference (EMR) signals: application to a rat glioma model at 4.7 Tesla. Magn Reson Med. 2016; 75:137-149;

[7] Heo H Y, Zhang Y, Jiang S, Lee D H, Zhou J. Quantitative assessment of amide proton transfer (APT) and nuclear overhauser enhancement (NOE) imaging with extrapolated semisolid magnetization transfer reference (EMR) signals: II. Comparison of three EMR models and application to human brain glioma at 3 Tesla. Magn Reson Med. 2016; 75:1630-1639;

[8] Zhou J, Payen J F, Wilson D A, Traystman R J, van Zijl P C M. Using the amide proton signals of intracellular proteins and peptides to detect pH effects in MRI. Nat Med. 2003; 9:1085-1090;

[9] Ward K M, Balaban R S. Determination of pH using water protons and chemical exchange dependent saturation transfer (CEST). Magn Reson Med. 2000; 44:799-802;

[10] Kogan F, Haris M, Singh A, et al. Method for high-resolution imaging of creatine in vivo using chemical exchange saturation transfer. Magn Reson Med. 2014; 71:164-172;

[11] Cai K, Haris M, Singh A, et al. Magnetic resonance imaging of glutamate. Nat Med. 2012; 18:302-306;

[12] Zaiss M, Herz K, Deshmane A, et al. Possible artifacts in dynamic CEST MRI due to motion and field alterations. J Magn Reson. 2019; 298:16-22;

[13] Bishop C M, Roach C M. Fast curve fitting using neural networks, Rev Sci Instrum. 1992; 63:4450-4456;

[14] LeCun Y, Bengio Y, Hinton G. Deep learning. Nature. 2015; 521:436-444;

[15] Schmidhuber J. Deep learning in neural networks: an overview, Neural Netw. 2015; 61:85-117;

[16] Domsch S, Mürle B, Weingärtner S, Zapp J, Wenz F, Schad L R. Oxygen extraction fraction mapping at 3 Tesla using an artificial neural network: a feasibility study. Magn Reson Med. 2018; 79:890-899;

[17] Bertleff M, Domsch S, Weingärtner S, et al. Diffusion parameter mapping with the combined intravoxel incoherent motion and kur tosis model using artificial neural networks at 3 T. NMR Biomed. 2017; 30(12):e3833. doi:10.1002/nbm.3833;

[18] Zaiss M, Deshmane A, Schuppert M, et al. DeepCEST: 9.4 T chemical exchange saturation transfer MRI contrast predicted from 3 T data—a proof of concept study. Magn Reson Med. 2019; 81:3901-3914;

[19] Prokudin S, Gehler P, Nowozin S. Deep directional statistics: pose estimation with uncertainty quantification. In: Ferrari V, Hebert M, Sminchisescu C, Weiss Y, eds. Computer vision—ECCV 2018. Vol. 11213. Cham: Springer; 2018:542-559;

[20] Kendall A, Gal Y. What uncertainties do we need in Bayesian deep learning for computer vision? In Proceedings of the $31^{st}$ International Conference on Neural Information Processing Systems, Long Beach, C A, 2017. p. 5580-5590;

[21] Gal Y, Ghahramani Z. Dropout as a Bayesian approximation: representing model uncertainty in deep learning. In Proceedings of the $33^{rd}$ International Conference on International Conference on Machine Learning—Volume 48, New York, NY, 2016. p. 1050-1059;

[22] Gast J, Roth S. Lightweight probabilistic deep networks. In Proceedings of the 2018 IEEE/CVF Conference on Computer Vision and Pattern Recognition, Salt Lake City, UT, 2018. p. 3369-3378;

[23] Nair T, Precup D, Arnold D L, Arbel T. Exploring uncertainty measures in deep networks for multiple sclerosis lesion detection and segmentation. In: Frangi A F, Schnabel J A, Davatzikos C, Alberola López C, Fichtinger G, editors. Medical image computing and computer assisted intervention—MICCAI 2018. Lecture notes in computer science. Cham: Springer; 2018. p. 655-663;

[24] Gal Y, Islam R, Ghahramani Z. Deep Bayesian active learning with image data. In Proceedings of the $34^{th}$ International Conference on Machine Learning—Volume 70, Sydney, Australia, 2017. p. 1183-1192;

[25] Bragman F J S, Tanno R, Eaton-Rosen Z, et al. Uncertainty in multitask learning: joint representations for probabilistic MR-only radiotherapy planning. In: Frangi A F, Schnabel J A, Davatzikos C, Alberola-López C, Fichtinger G, editors. Medical image computing and computer assisted intervention—MICCAI 2018. Lecture notes in computer science. Cham: Springer; 2018. p. 3-11;

[26] Breitling J, Deshmane A, Goerke S, et al. Adaptive denoising for chemical exchange saturation transfer MR imaging. NMR Biomed. 2019; 32:e4133;

[27] Goerke S, Soehngen Y, Deshmane A, et al. Relaxation-compensated APT and rNOE CEST-MRI of human brain tumors at 3 T. Magn Reson Med. 2019; 82:622-632;

[28] Zaiss M, Ehses P, Scheffler K. Snapshot-CEST: optimizing spiral-centric-reordered gradient echo acquisition for fast and robust 3D CEST MRI at 9.4 T. NMR Biomed. 2018; 31:e3879;

[29] Deshmane A, Zaiss M, Lindig T, et al. 3D gradient echo snapshot CEST MRI with low power saturation for human studies at 3T. Magn Reson Med. 2019; 81:2412-2423;

[30] Cox R W, Hyde J S. Software tools for analysis and visualization of fMRI data. NMR Biomed. 1997; 10:171-178;

[31] Chollet F, others. Keras. https://github.com/fchollet/keras. Published 2015. Accessed Jan. 7, 2019;

[32] Abadi M, Barham P, Chen J, et al. TensorFlow: a system for large-scale machine learning. In Proceedings of the 12th USENIX Symposium on Operating Systems Design and Implementation, Savannah, G A, 2016. p. 265-283;

[33] Kingma D P, Ba J. Adam: a method for stochastic optimization, arXiv. 2014; 14126980;

[34] Zaiss M, Windschuh J, Goerke S, et al. Downfield-NOE-suppressed amide-CEST-MRI at 7 Tesla provides a unique contrast in human glioblastoma. Magn Reson Med. 2017; 77:196-208;

[35] Morrison C, Henkelman R M. A model for magnetization transfer in tissues. Magn Reson Med. 1995; 33:475-482;

[36] Zaiss M, Schuppert M, Deshmane A, et al. Chemical exchange saturation transfer MRI contrast in the human brain at 9.4 T. NeuroImage. 2018; 179:144-155;

[37] Zhou I Y, Wang E, Cheung J S, Zhang X, Fulci G, Sun P Z. Quantitative chemical exchange saturation transfer (CEST) MRI of glioma using image downsampling expedited adaptive least-squares (IDEAL) fitting. Sci Rep. 2017; 7:84;

[38] Cohen O, Huang S, McMahon M T, Rosen M S, Farrar C T. Rapid and quantitative chemical exchange saturation transfer (CEST) imaging with magnetic resonance fingerprinting (MRF). Magn Reson Med. 2018; 80:2449-2463; and

[39] Cohen O, Zhu B, Rosen M S. MR fingerprinting deep reconstruction network (DRONE). Magn Reson Med. 2018; 80:885-894; and

[40] Liu H, Xiang Q-S, Tam R, MacKay A, Kramer J, Laule C. 150× acceleration of myelin water imaging data analysis by a neural network, Program Number 0152. In: Proceedings of ISMRM 27th Annual Meeting; 2019.

It is generally known that sophisticated MR contrasts, such as diffusion tensor imaging, quantitative susceptibility mapping or spectroscopic MR imaging, as well as spectrally selective CEST (chemical exchange saturation transfer) imaging, often require complex mathematical modeling before contrast generation. This modeling can be error-prone and time consuming, because it commonly must be carried out offline and sometimes requires user interaction and expert knowledge for evaluation. In the case of CEST, in vivo Lorentzian models [1, 2] as well as full Bloch equations [3-5] and simplified Bloch equations [6, 7] are used to evaluate and quantify spectrally selective effects. When correctly evaluated, these models allow to generate several interesting CEST contrasts simultaneously, such as the semi-solid compartment provided by the so-called magnetization transfer (MT) effect, as well as relayed nuclear Overhauser (NOE) effects correlating with protein content and conformation. Best known are the CEST effects of amide, amine, and guanidine protons related to peptides and proteins [8] as well as pH [9] and metabolite content of creatine [10] or glutamate [11].

Up to now, such sophisticated evaluations are not possible online in a robust manner, e. g. for medical imaging applications. For example, for CEST data, both acquisition and subsequent evaluation are prone to artifacts attributed to field inhomogeneity and motion [12]. Furthermore, as in many cases when nonlinear least squares optimization is involved, the results depend strongly on details of the fit model such as initial values, boundary conditions, and actual algorithm implementations. Last but not least, computations for 3D volume data can take hours depending on the algorithm [4].

However, the ability to generate MR contrast, like multiple CEST contrasts e. g. at a clinical 3T scanner would be highly desirable for clinical imaging. Therefore, to circumvent the above problems of complex non-linear models, it was proposed as early as 1992 to use neural networks to improve curve fitting [13]. Since then, deep learning [14, 15] has gained much interest within medical imaging as well as in many other branches of science. Deep learning was recently applied to circumvent the mentioned problems of complex non-linear models used in oxygen extraction fraction [16] and diffusion parameter mapping [17].

In CEST imaging, a first neural network approach was shown to successfully map 3T data to 9.4T CEST contrasts [18]. However, because deep neural networks (NN) are often considered as "black boxes" with limited insight into the mapping from input to prediction, a question that arises is how accurate and reliable such predictions are. A neural network that gives seemingly confident predictions for all possible inputs, regardless if reasonably supported by learning or not, may lead to critical failure cases and result in mistrust by potential users. Due to these limitations, available neural network based MR data analyses cannot be used in medical practice.

It is known that a quantitative evaluation of a prediction by a neural network is possible by the concept of uncertainty quantification in deep learning. This concept has been described in the past for special applications only, e.g. in computer vision [19-22] or in medical imaging, like MS lesion detection [23], melanoma detection [24] and generation of synthetic CT from MRI [25].

OBJECTIVE OF THE INVENTION

It is an objective of the invention to provide an improved method of processing MR data, being capable of avoiding limitations and disadvantages of conventional techniques. In particular, the method is to be capable of processing MR data with a neural network (NN), wherein a reliability of processing MR data with the NN can be evaluated, in particular quantified. Especially, the processing of the MR data, including an error prediction, is to be provided with increased reliability, low processing costs and/or improved ability of recognizing imaging artefacts. It is a further objective of the invention to provide an improved MRI scanner apparatus, being adapted for processing collected MR data and being capable of avoiding limitations and disadvantages of conventional techniques. In particular, the MR scanner apparatus is to be capable of NN based analyzing the MR data, including an uncertainty prediction of the NN output.

SUMMARY OF THE INVENTION

These objectives are respectively solved by a method of processing MR data, an MRI scanner apparatus, a computer program and an apparatus comprising a computer-readable storage medium, comprising the features of the independent claims. Advantageous embodiments and applications of the invention are defined in the dependent claims.

According to a first general aspect of the invention, the above objective is solved by a method of processing MR data of a sample under investigation, comprising the steps of provision of the MR data being collected with an MRI scanner apparatus and machine learning based data analysis of the MR data by supplying the MR data to an artificial neural network being trained with predetermined training data. According to the invention, at least one image parameter of the sample and additionally at least one uncertainty quantification measure representing a prediction error of the at least one image parameter are provided by output elements of the neural network.

According to a second general aspect of the invention, the above objective is solved by an MRI scanner apparatus, comprising an MRI scanner signal acquisition device, being arranged for collecting MR data, and a data processing unit that is configured for subjecting the MR data to a machine learning based data analysis with a neural network being trained with predetermined training data. According to the invention, the data processing unit is configured for creating at least one image parameter of the sample and for additionally creating at least one uncertainty quantification measure representing a prediction error of the at least one image parameter. Preferably, the MRI scanner apparatus or an embodiment thereof is configured for executing the method of processing MR data of a sample under investigation according to the first general aspect of the invention or an embodiment thereof.

Further independent subjects of the invention comprise a computer program residing on a computer-readable medium, with a program code which, when executed on a computer, carries out the method of processing MR data of a sample under investigation according to the first general aspect of the invention or an embodiment thereof, and an apparatus comprising a computer-readable storage medium containing program instructions which, when executed on a computer, carry out the method of processing MR data of a sample under investigation according to the first general aspect of the invention or an embodiment thereof.

Advantageously, the inventive application of a machine learning based data analysis of the MR data comprises an input of the MR data to the artificial neural network and a prediction of at least one image parameter of the sample and the prediction error of the at least one image parameter by the neural network. This approach deviates from the conventional calculation of MR contrasts with complex mathematical modelling, which can be computationally expensive and sensitive to fit algorithm parameters. Furthermore, the invention is in contrast to conventional approaches of neural network based MR data analyses [5, 6, 7, 13, 14, 15, 40], as the invention employs neural networks not only as a shortcut to conventional fitting, but also creates the at least one uncertainty quantification measure, which represents a quality metric for the predicted values (so-called uncertainty quantification).

Preferably, the artificial neural network comprises a deep neural network with an input layer made of input elements adapted to the format of MR data to be analysed, a plurality of network layers and a probabilistic output layer made of output elements adapted to the format of the at least one image parameter of the sample to be obtained and additional output elements providing the at least one uncertainty quantification measure.

The at least one image parameter of the sample comprises at least one physical or chemical sample feature that can be derived from the collected MR data, e. g. a single value or multiple values of the at least one sample feature at a certain sample location and/or a map (image) of sample features.

According to a preferred and particularly advantageous example, the at least one image parameter of the sample comprises at least one CEST contrast feature, that is obtained from collected MR data (e. g. unprocessed Z-spectra). Alternatively, other MR contrast features can be created as outlined below. In medical imaging, the invention substantially improves creating parameters of multi-pool Lorentzian fitting of CEST-spectra, e. g. at 3T. Additionally, the at least one uncertainty quantification measure allows radiographers to interpret the generated CEST maps with high confidence.

In particular in medical imaging, the inventors have demonstrated that the network trained with data of at least one healthy subject or at least one diseased subject, e. g. for brain imaging with a brain tumor patient, provides e. g. CEST contrasts, like NOE-CEST or amide CEST contrast, in particular based on 3T in vivo CEST MR data, in a fraction of the conventional evaluation time, and, simultaneously, the probabilistic network architecture enables the uncertainty quantification, indicating if predictions are trustworthy or not, as it has been shown by perturbation analysis conducted by the inventors.

The at least one uncertainty quantification measure (prediction uncertainty) of the at least one image parameter comprises a single uncertainty value or a plurality of uncertainty values, in particular an uncertainty map, indicating how confident the neural network is about predictions for the given input. Advantageously, the output layer of the neural network provides the at least one uncertainty quantification that indicates if the predictions are trustworthy or not. High uncertainty indicates a high probability of the network prediction being erroneous.

According to a preferred embodiment of the invention, the MR data analysis creates a parameter map of the at least one image parameter of the sample, and the at least one uncertainty quantification measure comprises an uncertainty map of an uncertainty quantity of the at least one image parameter. Advantageously, this allows a direct position resolved visualization of the uncertainty quantification measure, e. g. for showing whether the output image parameter map of the sample includes regions of reduced reliability.

With the uncertainty measures, in particular maps, created with the embodiment of the invention, an improved quality measure for predicted data is provided. The user gets additional information to judge if the predicted data is trustworthy or not (e.g., one could generate a segmentation mask indicating where the uncertainty is above/below a certain threshold and warn the user that the data in this region cannot be trusted). Just having an uncertainty map at hand, the user obtains an indicator if manual assessment by an expert is required to have a closer look at the acquired spectra in the respective regions and check for anomalies. In such cases, the conventional evaluation can be performed to see if there are deviations between prediction and ground truth. Furthermore, as a particular advantage, the spatial structure of the uncertainty measures can give hints about possible error sources (e.g., in case of vessel pulsation or low SNR). Similarly, the structure of the uncertainty maps could indicate missing coil elements, too low B1, or a bad shim. In addition to the pattern, the latter can be recognized by coincidently increased B0 shift predictions. Therefore, the user can then also decide if the measured data is valid or if a measurement has to be repeated with corrected shim/coil/B1 setting. Furthermore, a recommendation system could be trained based on the uncertainty maps to automatically recognize such failure cases, mask regions with high uncertainty or, if necessary, recommend to redo the scan with a corrected setup.

Preferably, the training data of the neural network are provided by a training with a Gaussian negative log-likelihood loss function. Advantageously, explicit uncertainty outputs are not required for the training and the Gaussian negative log-likelihood loss function has been proven as a reliable training function. Alternatively, if explicit uncertainty outputs are available with a particular application of the invention, they can be used for the training of the neural network.

According to a further advantageous embodiment of the invention, the training data of the neural network are provided by training data augmentation. The training data augmentation comprises a numerical enlargement of a given training data distribution of reference samples, e. g. subjects. Applying the training data augmentation has advantages for improving the reliability of uncertainty quantification.

Particularly preferred, the training data of the neural network are provided by training data augmentation with simulated $B_0$ shifts, simulated Gaussian noise in inputs and/or implant-like B0-artifacts. Advantageously, with these types of data, typical sources of error influencing MR data processing are incorporated into the training data augmentation.

With more details, training data augmentation has two desirable effects. First, training with noise leads to consistently increased uncertainties when applying a neural network to noise-corrupted data, representing the resulting prediction error more accurately than a network trained without augmentation. Second, including larger simulated B0 shifts in the training data allows better predictions for a larger range of B0 shifts of the input spectra. This resulted in lower prediction errors and consistently lower uncertainties for shifted input spectra when using NN1 compared to NN0. Therefore, including a plausible data augmentation, an advanced uncertainty prediction can be established using the proposed probabilistic predictive model. The uncertainty then indicates for example if input data is either corrupted as in a case where B0 artifacts shifted Z-spectra drastically, or in a case of vessels that can show noise-like pulsation artifacts in the spectral domain that are unique for a certain scan, or any other variation that was not in the training data. This can be seen in the results presented below, e.g. with reference to FIGS. 7 and 8.

If, according to a further preferred embodiment of the inventive method, a step of evaluating the at least one uncertainty quantification measure is provided, advantages for a practical application of the invention e. g. by a physician are obtained. Evaluating the at least one uncertainty quantification measure comprises comparing the at least one uncertainty quantification measure with reference data, e. g. uncertainty quantification measures from previous data analyses or numerical simulations, and providing an evaluation statement in dependency on the comparison result.

Particularly preferred, evaluating the at least one uncertainty quantification measure includes providing at least one semantic statement on the collection of the MR data, wherein the at least one semantic statement includes at least one of a confirmation of a successful collection of the MR data, a request for a repetition of the MR data, an indication of a system error influencing the collection of the MR data, an indication of a movement artefact influencing the collection of the MR data, an indication of an implant artefact influencing the collection of the MR data and a provision of a warning signal. Additionally or alternatively, evaluating the at least one uncertainty quantification measure may result in classifying the at least one uncertainty quantification measure into one of multiple, e. g. two or three or more, uncertainty classes. Additionally or alternatively, evaluating the at least one uncertainty quantification measure may comprise generating a segmentation mask providing a section of a region of investigation that is further examined, e. g. by another MR data collection, e. g. with changed measuring conditions.

According to further variants of the invention, evaluating the at least one uncertainty quantification measure includes recognizing a general noise level of the MR data and/or recognizing corrupted MR data. With these embodiments, advantages for a further assessment of the at least one uncertainty quantification measure are obtained.

The inventive MR data processing can be conducted immediately after collecting the MR data, e. g. by the MRI scanner apparatus used for collecting the MR data, i. e. it is included in an MR examination process. In particular, the step of creating the at least one image parameter of the sample and the at least one uncertainty quantification measure can be included in an image reconstruction procedure conducted by the MRI scanner apparatus. Alternatively or additionally, the inventive MR data processing can be conducted offline with pre-stored collected MR data, e. g. for a post-processing of available MR data. With the latter embodiment, in particular the step of creating the at least one image parameter of the sample and the at least one uncertainty quantification measure can be conducted separately from the operation of the MRI scanner apparatus. MR data collected in the past can be subjected to a further analysis, e. g. for obtaining additional mapping information on the sample.

According to preferred applications of the invention, the at least one image parameter of the sample comprises at least one of an exponential T1, T2 map, a multi-exponential T1, T2 map, a spectroscopic imaging map, a compartmental map of parameters, an apparent diffusion coefficient (ADC)-map for varying B-values, a Kurtosis parameter map, a parameter map of perfusion and dynamic contrast enhanced imaging, a parameter map of spectroscopic imaging of nuclei, at least one CEST parameter, a field parameter map (B1, B0), and a parameter map representing at least one of motion, breathing and pulsation with known non-linear influence. In case of CEST contrast measurement, the at least one CEST parameter preferably includes at least one of Z-spectra modelled by Multi-Lorentzian regression, Henkelman-based water, MT and CEST pool regression of effect strength, proton pool sizes and exchange and relaxation rates, a pH map derived from CEST data or 31P spectroscopy data, a pseudo-PET map derived from multi-modal MRI and CEST MRI, a pseudo-CT map derived from multi-modal MRI, and a histology parameter map.

With further advantageous applications of the invention, a compartmental map of parameters, e. g. fat-water parameters, or pharmacokinetic parameters, a parameter map of perfusion and dynamic contrast enhanced imaging, in particular including modelling of input function, for Gadolinium based contrast agents as well as glucose, or glycosamines or oxymethyl glucose (OMG), a parameter map of spectroscopic imaging (in particular MRSI, CSI, or ESPI) of nuclei, or a field parameter map (B1, B0), in particular including Bloch-Siegert shift based B1 mapping, multi-flip angle mapping, DREAM or WASABI, is created in combination with the at least one uncertainty quantification measure Features disclosed in the context of the method of processing MR data of the sample under investigation and the embodiments thereof also represent preferred features of the inventive MRI scanner apparatus and vice versa. The aforementioned aspects and inventive and preferred features may also apply for the food manufacturing method. The preferred embodiments, variants and features of the invention described above are combinable with one another, e. g. in dependency on requirements of a practical application.

BRIEF DESCRIPTION OF THE DRAWINGS

Further advantages and details of the invention are described in the following with reference to the attached drawings, which schematically show in.

DETAILED DESCRIPTION OF PREFERRED EMBODIMENTS OF THE INVENTION

Embodiments of the invention are described in the following with particular reference to the configuration of the neural network for MR data processing, including creating at least one uncertainty quantification measure. The invention preferably is implemented with an MRI scanner as it is known per se. Accordingly, details of the MRI scanner, the available control schemes thereof, available excitations and read-out sequences, available schemes of MR signal acquisition and types of MR data are not described as they are known per se from prior art. Exemplary reference is made to the processing of CEST data. The implementation of the invention is not restricted to this particular type of data, but rather possible with other MR contrasts, e. g. as mentioned above. Furthermore, exemplary reference is made to providing uncertainty maps as the at least one uncertainty quantification measure. It is to be noted, that a single quantitative error value or a group of error values can be provided as the at least one uncertainty quantification measure.

Embodiments of the MR Data Processing Method and MRI Scanner Apparatus

Figure 1:
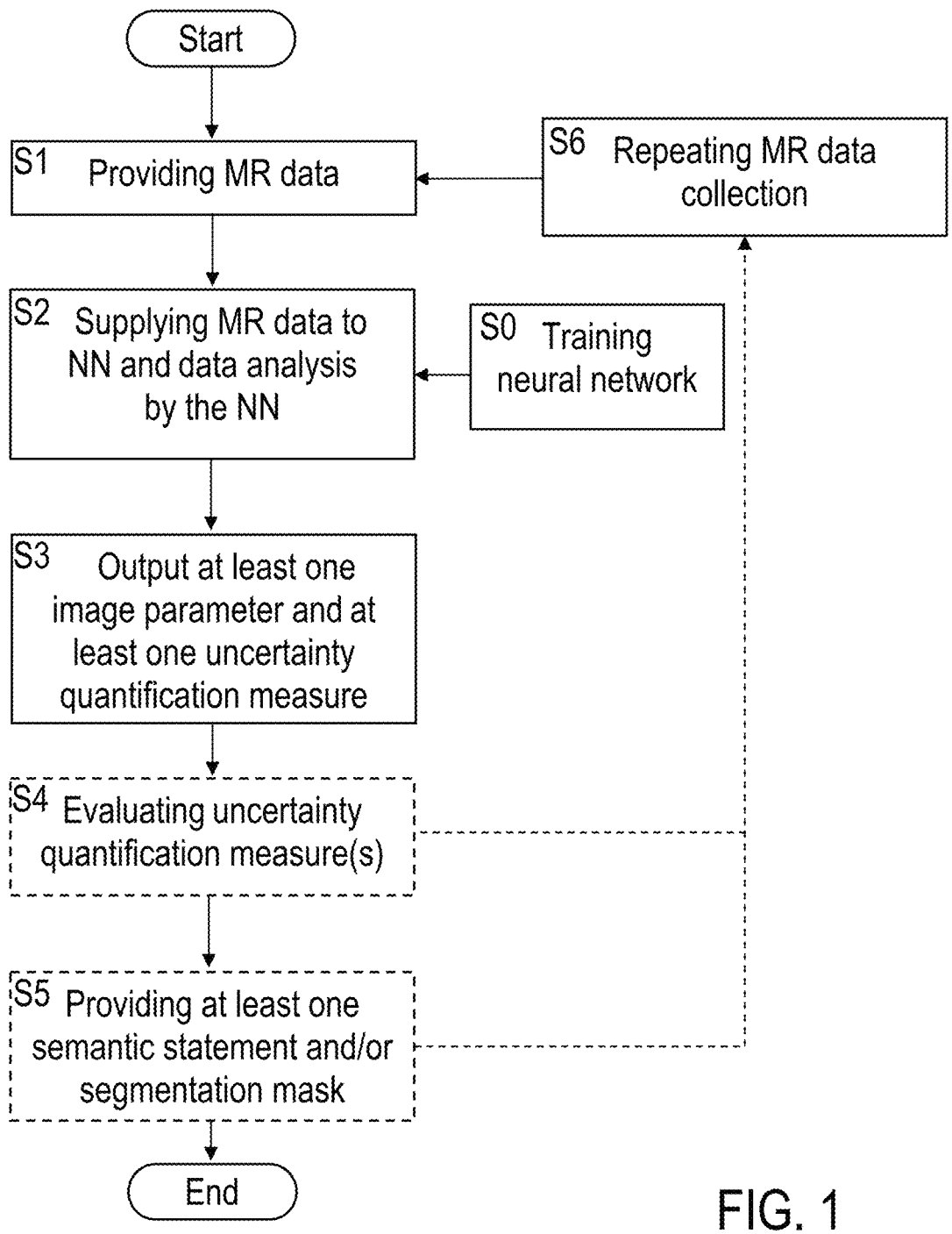
FIGS. 1 and 2: flowcharts illustrating features of preferred embodiments of the inventive method of processing MR data.

FIG. 1 generally illustrates features of the MR data processing using a neural network, including the steps of providing the MR data being collected with an MRI scanner apparatus (S1), supplying the MR data to an artificial neural network with a data analysis of the MR data (S2), wherein the neural network has been trained with predetermined training data (S0), and output of at least one image parameter of the sample and additionally at least one uncertainty quantification measure by output elements of the neural network (S3). In general, the neural network is trained for each setting of the MRI scanner apparatus (e.g. for each specific sequence parameters used for collecting the MR data). Optionally, further steps of evaluating the at least one uncertainty quantification measure (S4) and providing at least one semantic statement to the user of the MR data processing and/or generating a segmentation mask (S5) can be conducted. In case of strong uncertainty, e. g. when the uncertainty quantification measure exceeds a predetermined threshold, MR data collection can be repeated (S6) for improving the MR data and the MR data analysis result.

Figure 2:
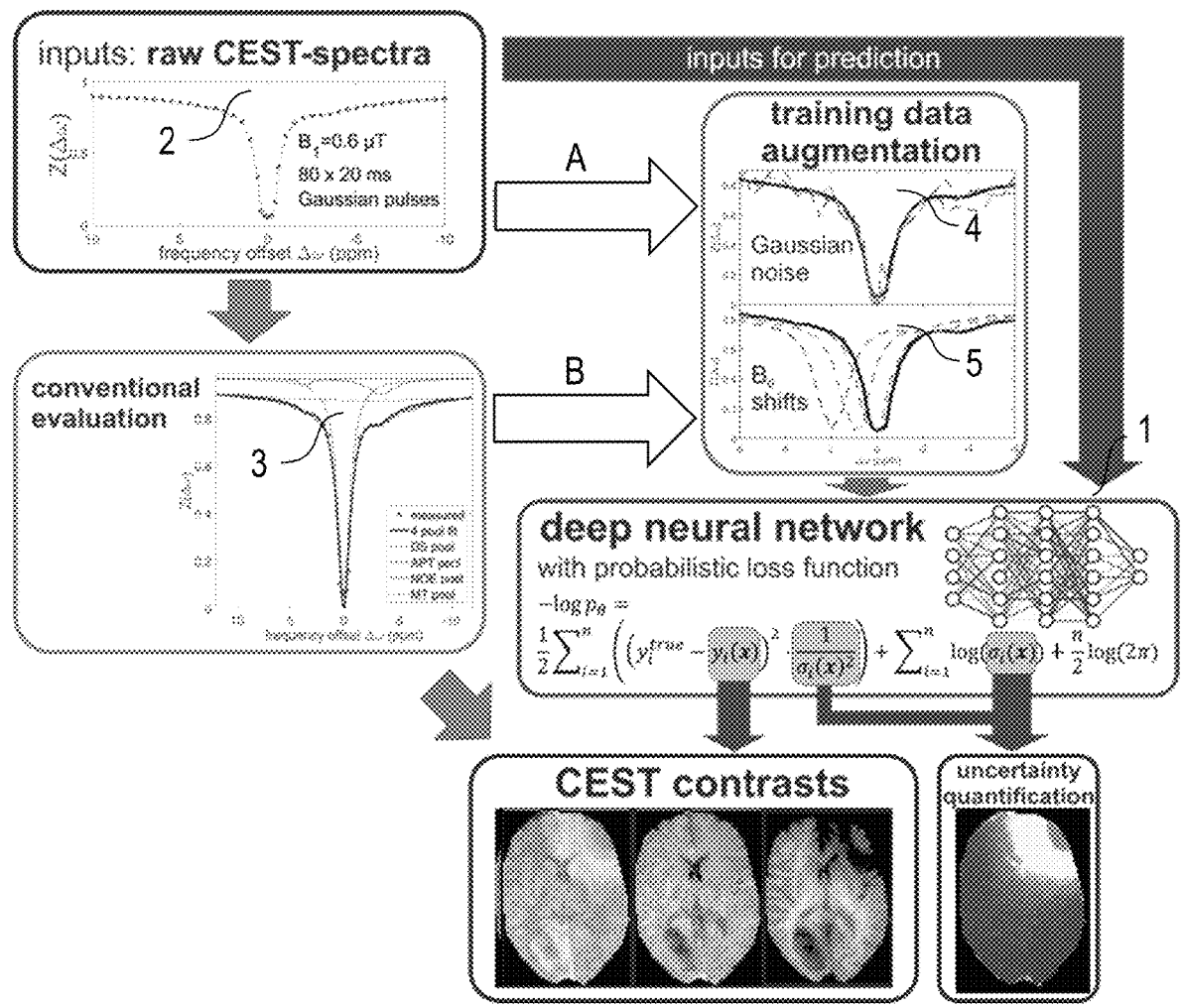

FIG. 2 shows further details of the data processing pipeline of the steps of training (S0) and applying the neural network (S2) in an exemplary manner. The schematically illustrated deep feed-forward neural network 1 was set up with available software tools, based on Tensorflow [32] or Keras [31]. For the training of the neural network 1 (step S0 in FIG. 1), Z-spectra 2 at e.g. 55 frequency offsets between e. g. +/−100 ppm were acquired from multiple, e. g. 4 or more, healthy subjects and at least one brain tumor patient at e. g. 3 different sites with MRI scanner apparatuses 100 (see FIG. 3), e. g. 3T whole-body MRI systems, like the MAGNETOM Prisma, Siemens Healthcare, Erlangen, Germany, using a 3D snapshot-CEST sequence [28] and a low-power pre-saturation block [29]. The Z-spectra 2 were de-noised by principal component analysis using the median truncation criterion [26]. The Z-spectra 2 were used as input for the training of the neural network 1 (see arrow A).

Figure 3:
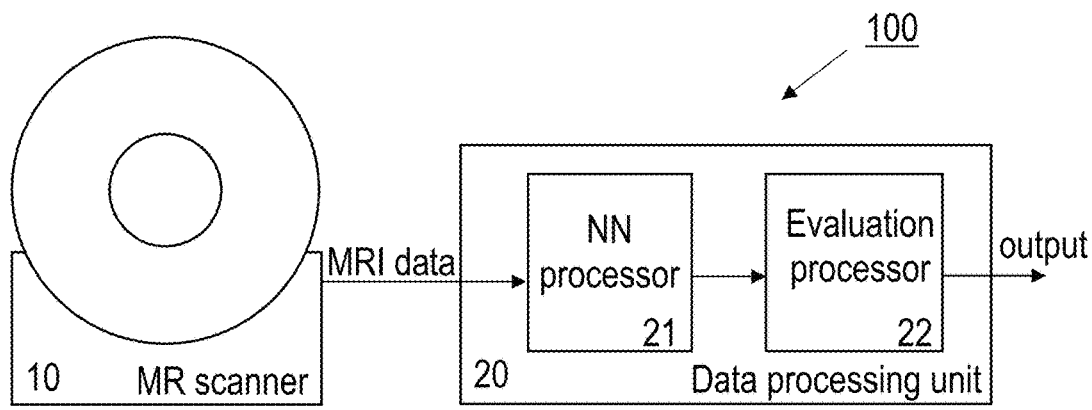
FIG. 3: a schematic illustration of features of preferred embodiments of the inventive MRI scanner apparatus.

FIG. 3 shows an example of an MRI scanner apparatus 100, which comprises an MRI scanner 10 (image data acquisition unit) for collecting MR data and a data processing unit 20 (image reconstruction unit), including a neural network processor 21 and optionally an evaluation processor 22. The network processor 21 is arranged for applying the inventive MR data analysis, including the output of uncertainty quantification, e. g. prediction errors, a map of prediction errors and/or a semantic statement/segmentation mask. The evaluation processor 22 can be arranged for conducting the steps S4 and S5 of FIG. 1. The data processing unit 20 comprises at least one computer circuit (hardware chip) being included in or coupled with the MRI scanner 10. Details of operating the data processing unit 20, in particular for the configuration of the NN and for the evaluation step, are implemented as known from conventional computer circuits, with an adaptation to the inventive MR data analysis.

With further details of a particular example, CEST MRI data acquisition can be performed on 8 healthy subjects at 3 different sites with identical 3T whole-body MRI systems and identical 64 channel receive coils. Additionally, one patient with a brain tumor was measured using the same hardware and protocols. The used 3D snapshot-CEST sequence was composed of a low-power spectrally selective saturation block and an RF and gradient spoiled gradient-echo readout with centric spiral reordering (elongation factor E=0.5). Readout parameters were FOV=220×180×60 mm$^3$ and matrix size=128×104×12 for 1.7×1.7×5 mm$^3$ resolution, TE=2 ms, TR=4 ms, bandwidth=700 Hz/pixel, and flip angle (FA)=6°. With these settings, the readout time was $t_{RO}$=2.5 s.

For the spectrally selective CEST saturation block, parameters optimized according to [29] were used. A train of 80 Gaussian-shaped RF pulses, each with a pulse duration of $t_{pulse}$=20 ms separated by a delay of $t_{delay}$=20 ms (duty cycle DC=50%) and a single nominal $B_1$ level of $B_1$=0.6 µT was applied before each readout, resulting in a total saturation time of $T_{sat}$=3.2 s. A crusher gradient can be applied after the pulse train to spoil spurious transverse magnetization. Saturation and readout were repeated at 55 off-resonance frequencies in the range between −100 ppm and 100 ppm, and at −300 ppm for an unsaturated reference image. Saturation and readout resulted in an acquisition time per offset of TA=6.1 s. For 55 frequency offsets and a 12 s recovery time before the first CEST module, this yielded a total scan time of about 5.35 min for 1 subject.

A conventional evaluation with a four-pool Lorentzian fit model [27] was used describing direct water saturation (DS), semi-solid magnetization transfer (MT), amide (APT) and relayed NOE peaks, for obtaining target data 3 for the network training. The model includes the water frequency shift $\delta_{DS}$ as free parameter and thus takes $B_0$ inhomogeneity into account. The target data 3 were used as further input for the training of the neural network 1 (see arrow B).

With further details of the evaluation with the four-pool Lorentzian fit model, the reconstructed data sets were registered to the first unsaturated image using the AFNI 3Dvolreg function [30]. Z-spectra in each voxel were calculated from the saturated image $S_{sat}$ and unsaturated reference image $S_0$ as $$Z(\Delta\omega) = \frac{S_{sat}(\Delta\omega)}{S_0}.$$

Brain masks for each subject data set were created manually. The Z-spectra were spectrally de-noised by principal component analysis (PCA) (see [26]) keeping only the principal components suggested by the median criterion. To isolate CEST effects, the four-pool Lorentzian fit model of [27] was used to fit the direct water saturation (DS), semi-solid magnetization transfer (MT), amide proton transfer (APT), and relayed NOE peaks, using the model equation $$Z(\Delta\omega) = c - L_{DS} - L_{APT} - L_{NOE} - L_{MT}$$

with a constant c, the direct saturation pool $$L_{DS} = \frac{A_{DS}}{1 + \left(\frac{\Delta\omega - \delta_{DS}}{\Gamma_{DS}/2}\right)^2}$$

and the other pools $$L_i = \frac{A_i}{1 + \left(\frac{\Delta\omega - \delta_{DS} - \delta_i}{\Gamma_i/2}\right)^2}, i \in \{APT, NOE, MT\}$$

with amplitudes $A_i$, full-width-at-half-maximum $\Gamma_i$, and peak positions $\delta_i$. This model has e. g. 10 free parameters in total (4 amplitudes $A_i$, 4 widths $\Gamma_i$, water peak position $\delta_{DS}$, and constant c), as the positions of APT, NOE, and MT peaks can be fixed, e. g. at +3.5 ppm, −3.5 ppm, and −2.5 ppm relative to the water peak position, respectively, and were therefore not treated as free parameters. Including the water peak shift $\delta_{DS}$ in the denominator of the APT, NOE, and MT peaks, $L_i$, allows the modeled spectra to shift along the frequency axis while relative peak positions stay fixed.

Lorentzian fitting was performed by non-linear least squares optimization with the software tool MATLAB. Least squares Lorentzian fitting evaluation for a single subject 3D volume took about 10 min using a computer with Intel Xeon W-2145 3.7 GHz CPU, 8 cores, 12 parallel threads, and 32 GB RAM.

The neural network 1 includes multiple output elements (output neurons), representing image parameters of the samples, e. g. the free parameters of the Lorentzian model of the target data 3, to be obtained. Based on approaches of learned output variance via maximum-likelihood estimation employed in computer vision [20, 19, 22], the neural network 1 additionally has e. g. 10 output neurons representing uncertainties $\sigma(x) = (\sigma_1(x), \ldots, \sigma_n(x))$ of each Lorentzian parameter. These uncertainty outputs are indirectly inferred from the training data 3 by training with a Gaussian negative log-likelihood loss function $\rho$ $$-\log p_\theta(\mu^{tgt}; \mu(x), \sigma(x)) = \frac{1}{2}\sum_{i=1}^{n}\left(\frac{\mu_i^{tgt} - \mu_i(x)}{\sigma_i(x)}\right)^2 + \sum_{i=1}^{n}\log(\sigma_i(x)) + \frac{n}{2}\log(2\pi)$$

with the ground-truth training targets $\mu_i^{tgt}$ obtained by conventional least squares fitting, as it is illustrated in FIG. 2.

With further details, the neural network is configured as follows. The neural network architecture preferably used is a deep feed-forward neural network consisting of fully connected layers, also known as multilayer perceptron. It takes vectors x of e. g. 55 elements representing the measured raw Z-spectra as inputs and maps them to vectors $\mu(x) = (\mu_1(x), \ldots, \mu_n(x))$ of n=10 elements representing the free parameters of the 4-pool Lorentzian model described above. The mapping is realized by sequential application of matrix multiplication (each matrix containing the weights of a layer) and a non-linear activation function. To make the neural network probabilistic and by that allow for uncertainty estimation, it has multiple, for instance 10 additional output neurons that represent the uncertainty $\sigma(x) = (\sigma_1(x), \ldots, \sigma_n(x))$ of each Lorentzian parameter. In total, the neural network represents the function $f_\theta(x) = (\mu_\theta(x), \alpha_\theta(x)) \in \mathbb{R}^{2n}$, which is parametrized by the layer weights $\theta$ that are adjusted during training.

Therefore, the number of neurons in the output layer is doubled compared to standard non-probabilistic neural networks, which would only output $\mu_\theta(x)$. The additional uncertainty outputs $\sigma_i(x)$ do not have to be given as explicitly labeled targets for training, but are indirectly inferred from the training data by applying the principle of maximum likelihood $$\arg\min_\theta\{-\log p_\theta(\mu^{tgt};\mu_\theta(x),\sigma_\theta(x))\}$$

with the ground-truth training targets $\mu_{tgt}$ and likelihood function $p_\theta$. Similar approaches of implicitly learned output variance via maximum likelihood estimation for deep neural networks have been used in computer vision [19, 20, 22] and are sometimes referred to as "heteroscedastic aleatoric uncertainty". A Gaussian likelihood function given by $$p(\mu^{tgt}; \mu_\theta(x), \sigma_\theta(x)) = \frac{1}{(2\pi)^{\frac{n}{2}}\prod_{i=1}^{n}\sigma_i(x)}\exp\left\{-\frac{1}{2}\sum_{j=1}^{n}\left(\frac{\mu_i^{tgt} - \mu_i(x)}{\sigma_i(x)}\right)^2\right\}$$

is assumed, which results in the negative log-likelihood loss function $$-\log p_\theta(\mu^{tgt}; \mu_\theta(x), \sigma_\theta(x)) = \frac{1}{2}\sum_{i=1}^{n}\left(\frac{\mu_i^{tgt} - \mu_i(x)}{\sigma_i(x)}\right)^2 + \sum_{i=1}^{n}\log(\sigma_i(x)) + \frac{n}{2}\log(2\pi)$$

for a single input-output pair $(x, \mu_{tgt})$. For training the network with a batch of M training examples $$(x_j, \mu_j^{tgt}), j = 1, \ldots, M$$

the average Gaussian log-likelihood training loss function $$\overline{GNLL_\theta} = -\frac{1}{M}\sum_{j=1}^{M}\log p_\theta(\mu_j^{tgt}; \mu_\theta(x_j), \sigma_\theta(x_j))$$

is numerically minimized with respect to the layer weights θ. The learned network outputs consequently represent Gaussian probability distributions with mean $\mu_i(x)$ and SD $\sigma_i(x)$. The mean $\mu_i(x)$ is the predicted value of a Lorentzian parameter for a certain input spectrum x, whereas the SD $\sigma_i(x)$ indicates the uncertainty of target parameters for given x. The mapping from x to $\sigma_i(x)$ is indirectly inferred during training as the optimization algorithm tries to minimize the log-likelihood loss function evaluated on the training data. By that, the distribution of training targets for given inputs is implicitly incorporated in the $\sigma_i(x)$ outputs of the network.

For a standard non-probabilistic neural network, the SDs $\sigma_i$ would be assumed to be constant and independent of the inputs x, which reduces minimization of the above GNLL loss function to minimization of the commonly used mean squared error loss function $$MSE_\theta = \frac{1}{n}\sum_{i=1}^{n}(\mu_i^{tgt} - \mu_i(x))^2$$

For minimizing the above probabilistic log-likelihood GNLL loss function, the optimization algorithm used for training can either adjust the network weights θ to reduce the residual prediction error $\mu^{tgt}-\mu(x)$ or increase the uncertainty output $\sigma_i(x)$.

If the residual prediction error in the loss function cannot be reduced for training samples with similar inputs x but different targets $\mu_{tgt}$, an unequivocal mapping is not possible, because for one input there are multiple outputs. The above non-probabilistic least squares MSE loss function would just assume high values for such training data. Minimizing the log-likelihood loss function, however, forces the optimizer to reduce the contribution of such unresolvable prediction errors by increasing σi(x) (i.e., telling that the network output is uncertain for such inputs). The second summand in the loss function prevents the optimizer from making excessive use of increased $\sigma_i(x)$ to reduce the loss. Therefore, it is supposed to find a compromise of assigning low uncertainty to inputs with low prediction error and high uncertainty only where good predictions are not possible.

The neural networks were implemented with available software tools, like in Keras [31] frame-work with Tensorflow [32] backend. Adam optimization algorithm [33] was used with mini-batches of size 64 and a learning rate of $10^{-4}$. Training data can be randomly split in training and validation sets containing 90% respectively 10% of the samples. The training set can be used for calculating gradients and updating the networks weights, whereas the validation set was only used to monitor the loss. Networks were trained for 5000 epochs (1 epoch means processing the whole training set once and updating the network weights), and the weights giving the best validation loss were saved. Input data was standardized to mean=0 and SD=1.

Hyperparameter estimation of number of layers, neurons per layer, activation function, dropout rate, and regularization can be performed by a grid search process. For the results described below, data sets of 3 healthy subjects were used for training, which yielded after brain mask application and dropping the lowest and uppermost slices a total number of 135,752 training samples (1 training sample means 1 Z-spectrum together with optimized Lorentzian parameters).

For comparison, a non-probabilistic network was trained to only predict the Lorentzian parameters μ(x) without additional uncertainty outputs, as described below. For training this network, the above mean squared error MSE loss function was used. Apart from that, all network parameters of the non-probabilistic network were the same as for the inventive network.

Additionally, two types of training data augmentation were investigated (see FIG. 2):
1. Additional B0 shifts: for each Z-spectrum used as training input, a value $\Delta\delta_{DS}$ is randomly drawn from the uniform distribution in a range of ±0.8 ppm. The Z-spectrum is shifted along the frequency axis by Δδ using linear interpolation and the corresponding target value is updated as $\delta_{DS} \rightarrow \delta_{DS} + \Delta\delta_{DS}$.

2. Gaussian noise of a various SDs (0.1%, 1%, 5%, 10%, and 50%) is applied to the input Z-spectra while leaving corresponding target vectors unaffected.

Exemplary Results

With the results of practical tests of the invention, as shown in FIGS. 4 to 7 and described in the following, the inventors have found the following features and advantages of the invention.

Firstly, it has been found, that the neural network is able to generalize to test data that was not included in training. Furthermore, it is even able to predict CEST contrasts for a tumor patient data set, although trained only on healthy subject data sets. This advantage has been proven by testing the trained network on a further healthy subject data set as well as on a tumor patient data set, and the predictions were compared to the results of conventional Lorentzian fitting using the Pearson correlation coefficient and Bland-Altmann analysis.

As an essential advantage, the uncertainty estimation has been found to accurately reflect corrupted input data, and it indicates if input data exceeds the range of data learned during training. Furthermore, the augmenting the network training data additionally improves the prediction and uncertainty estimation. To address these features, perturbations with Gaussian noise and strong B0 shifts were applied to the test data set. To this end, Gaussian noise with amplitudes of 1%, 2%, 3%, 4%, 5% and 10% as well as relative B0 shifts of 0.1, 0.2, 0.3, 0.5, 0.1 and 2 ppm were applied to Z-spectra in a single slice from the healthy test subject. These are in similar ranges as for the data augmentation, but not identical. The dependency of uncertainty estimation on the strength of perturbation was investigated using mean and SD of prediction error (least squares fit—NN prediction) and mean uncertainty in the whole slice as well as voxel-wise scatter plots of prediction error and uncertainty.

In the following, the network trained without augmentation is called NN0, and the network trained on an augmented training data set is indicated as NN1. The non-probabilistic network trained for comparison purposes is indicated as NNnonprob below.

Figure 4:
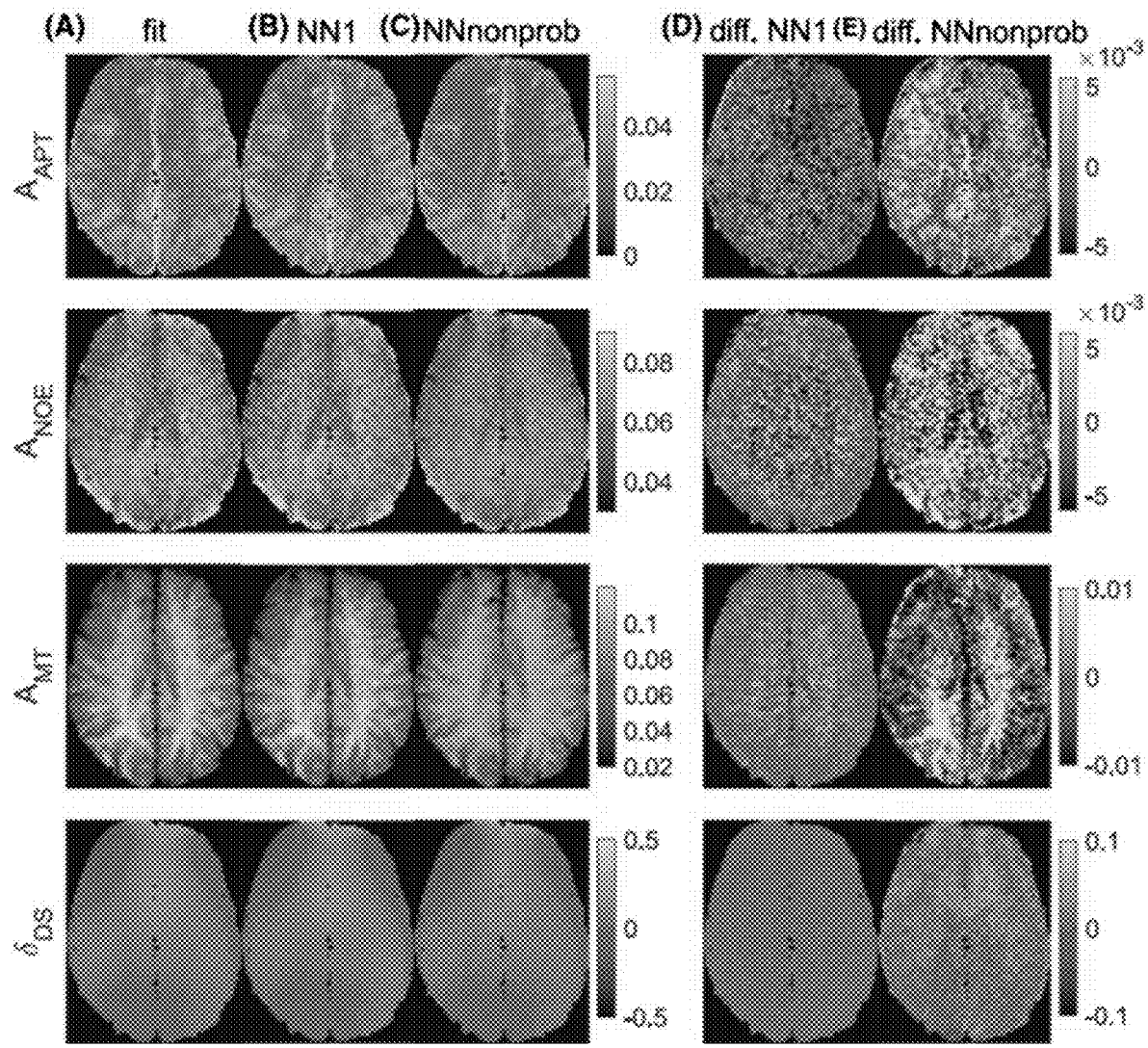
FIGS. 4 to 9: illustrations of results obtained with exemplary applications of the invention.
Figure 5:
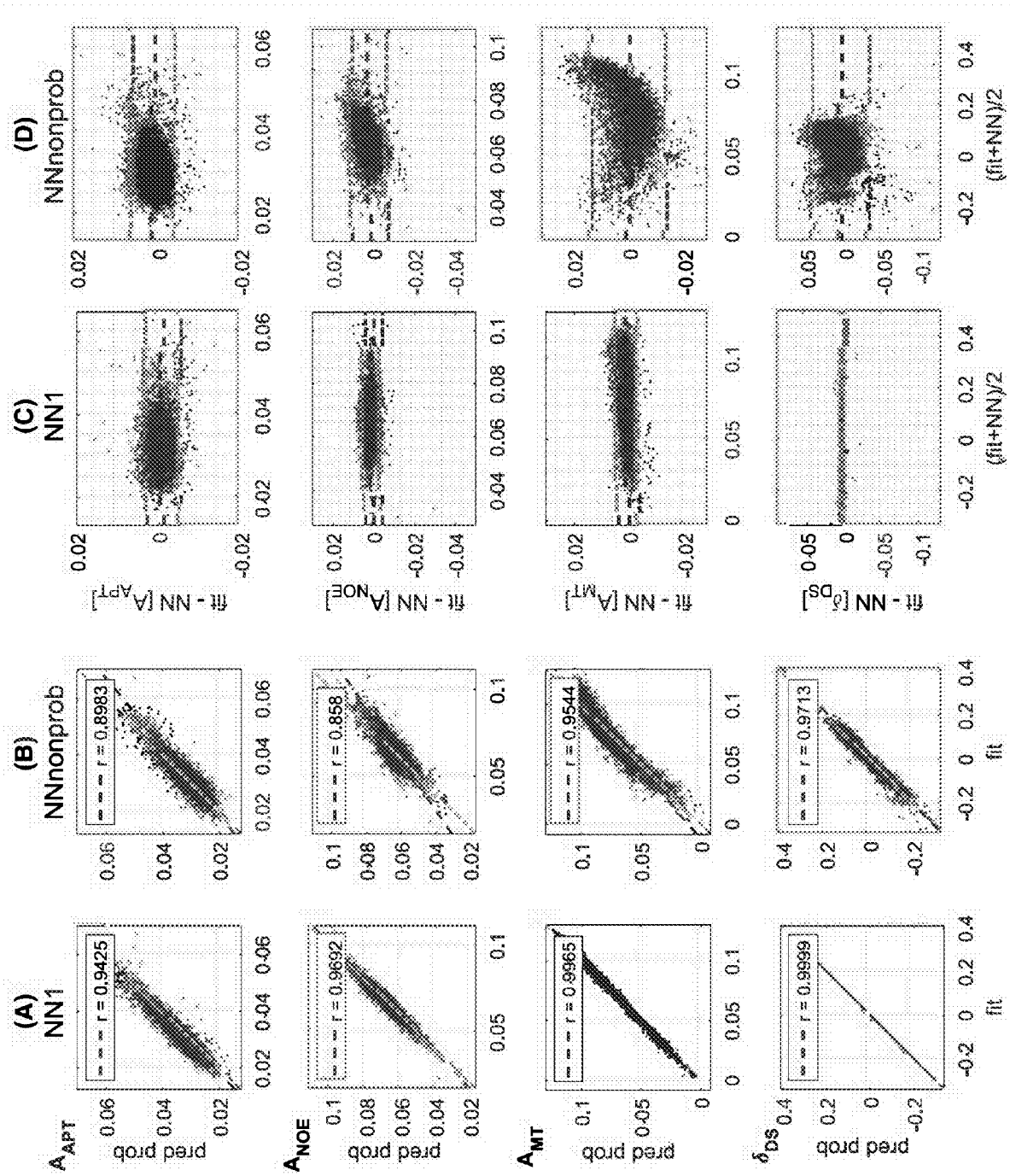

FIG. 4 compares the results of conventional 4-pool Lorentzian least squares fit evaluation with the NN1 and NNnonprob predictions generated from the test data set. In detail, FIG. 4A shows parameter maps obtained by least squares fit, FIG. 4B shows NN1 predictions of Lorentzian parameters, FIG. 4C shows NNnonprob predictions of Lorentzian parameters, FIG. 4D shows differences between fit results and NN1 predictions, and FIG. 4E shows differences between fit results and NNnonprob predictions. FIG. 5 illustrates the application of NN1 and NNnonprob to test data set, including scatter plots of prediction results for NN1 (FIG. 5A) and NNnonprob (FIG. 5B) against ground truth fit results and Bland-Altmann analysis (difference versus mean of NN and conventional method) for NN1 (FIG. 5C) and NNnonprob (FIG. 5D). Legends in the scatter plots give the Pearson correlation coefficient r between prediction and ground truth. In FIGS. 4 and 5, rows correspond to the parameters APT, NOE, and MT amplitude and SDS of CEST contrast.

The predicted parameter maps of NN1 (FIG. 4B) show the expected gray-white matter contrasts in the peak amplitudes of APT, NOE, and MT. Difference maps between NN1 predictions and ground truth shown in FIG. 4D exhibit spatial structures especially at the edges of the displayed slice, but of rather small magnitude of about 5%. Compared to that, the NNnonprob predictions (FIG. 4C) deviate more strongly from the ground truth (FIG. 4A), resulting in depleted con-tracts and larger prediction errors (FIG. 4E). Quantitative analysis of NN1 and NNnonprob predictions given in FIG. 5 supports the observation that NN1 predictions for all parameters closely match the least squares fit results (Pearson correlation coefficient of 0.94 and 0.97 for APT and NOE amplitudes, respectively, and >0.99 for MT amplitude and $\delta$DS). This finding is confirmed for NN1 by the scatter plots (FIG. 5A) and Bland-Altmann analysis (FIG. 5C) showing small bias and few outliers for all parameters.

The poorer performance of NNnonprob compared to NN1 is also confirmed by the scatter (FIG. 5B) and Bland-Altmann (FIG. 5D) plots and lower Pearson correlation coefficients (below 0.9 for APT and NOE peak amplitudes, for MT peak amplitude and 0.97 for water shift $\delta$DS). Especially, NNnonprob predictions of the MT peak amplitude show systematic deviations for high amplitudes.

Figure 6:
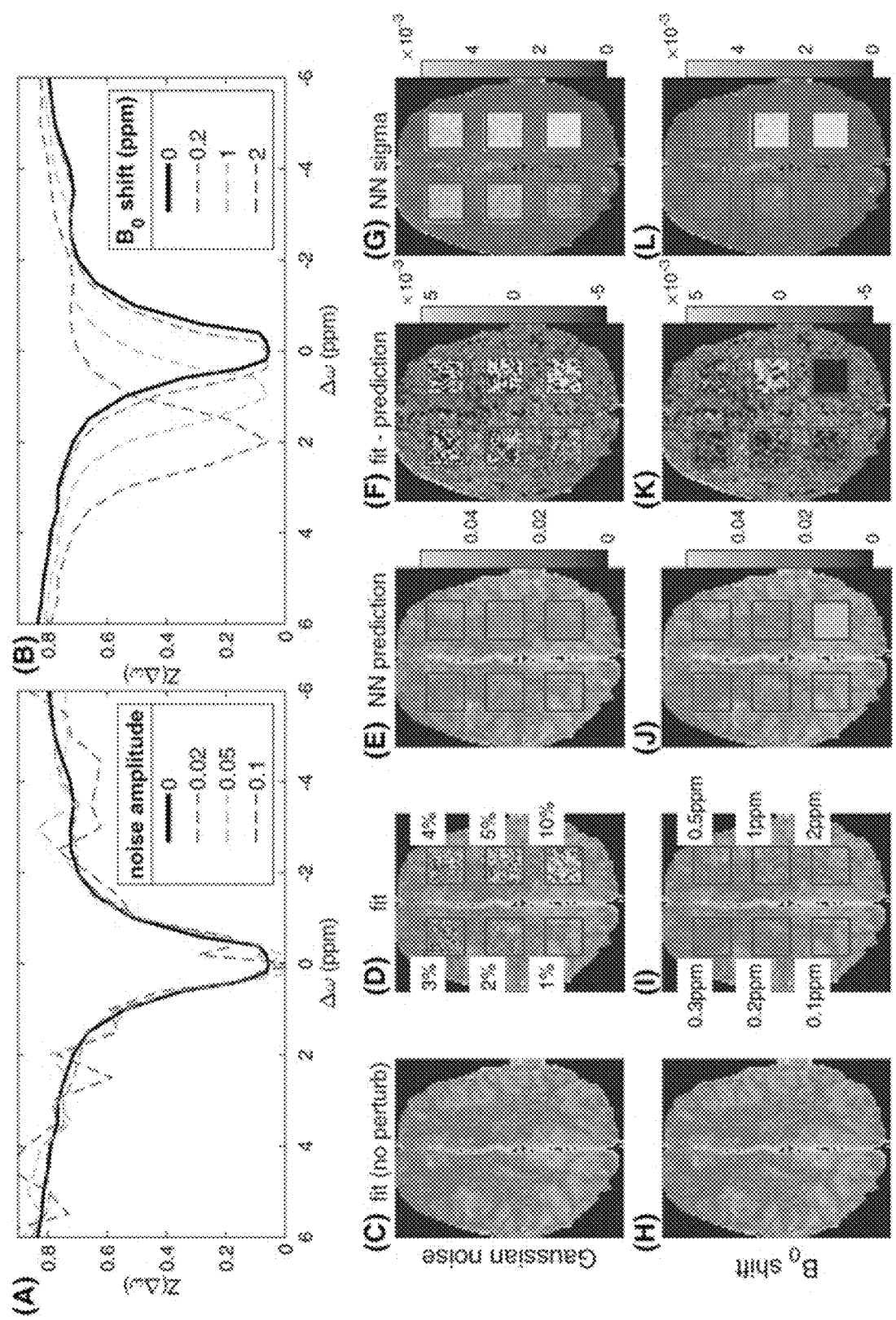

Similar comparisons of probabilistic and non-probabilistic networks were performed for different network architectures as well as for augmented and non-augmented training data, as shown in FIG. 6. In detail, FIG. 6 illustrates the effect of input perturbation on fit results and NN1 outputs, wherein FIGS. 6A and 6B represent examples of input Z-spectra showing the corruption with Gaussian noise and B0 shifts, resp. FIGS. 6C and 6H show fit results from original data, and FIG. 6D shows fit results from noise corrupted data. Noise of amplitudes 1%, 2%, 3%, 4%, 5%, and 10% were applied to 6 rectangular ROIs within the displayed slice, as indicated by boxes with corresponding labels, giving the noise amplitudes. FIG. 6E shows NN1 predictions from noise corrupted data, and FIG. 6F shows the prediction error, i.e., difference of fit and NN1 prediction (both on noise corrupted data). FIG. 6G represents the NN1 uncertainty in case of noise corrupted input data, and FIG. 6I shows fit results from input data corrupted by B0 artifacts. Frequency shifts of 0.1 ppm, 0.2 ppm, 0.3 ppm, 0.5 ppm, 1 ppm, and 2 ppm were applied to the input Z-spectra in the same rectangular ROIs as before. FIG. 6J illustrates NN predictions from B0 corrupted data. FIG. 6K shows the prediction error, i.e., difference of fit and NN1 prediction (both on B0 corrupted data), and FIG. 6L illustrates NN1 uncertainty in case of B0 corrupted input data.

In all cases, the probabilistic networks were found to provide better predictions than those trained without uncertainty outputs. However, there are cases in which the neural network fails to give accurate predictions. To assess these limitations, the same test data set was artificially corrupted (1) by adding Gaussian noise of different SDs to the input Z-spectra, and (2) by shifting the input Z-spectra along the frequency axis using linear interpolation, which mimics B0 artifacts. Example spectra after both types of perturbation are shown in FIGS. 6A and 6B. Exemplary results for the APT peak amplitude with both types of input perturbation are shown in FIGS. 6C to 6L. Results for the remaining Lorentzian parameters show similar behavior on input perturbation.

Figure 7:
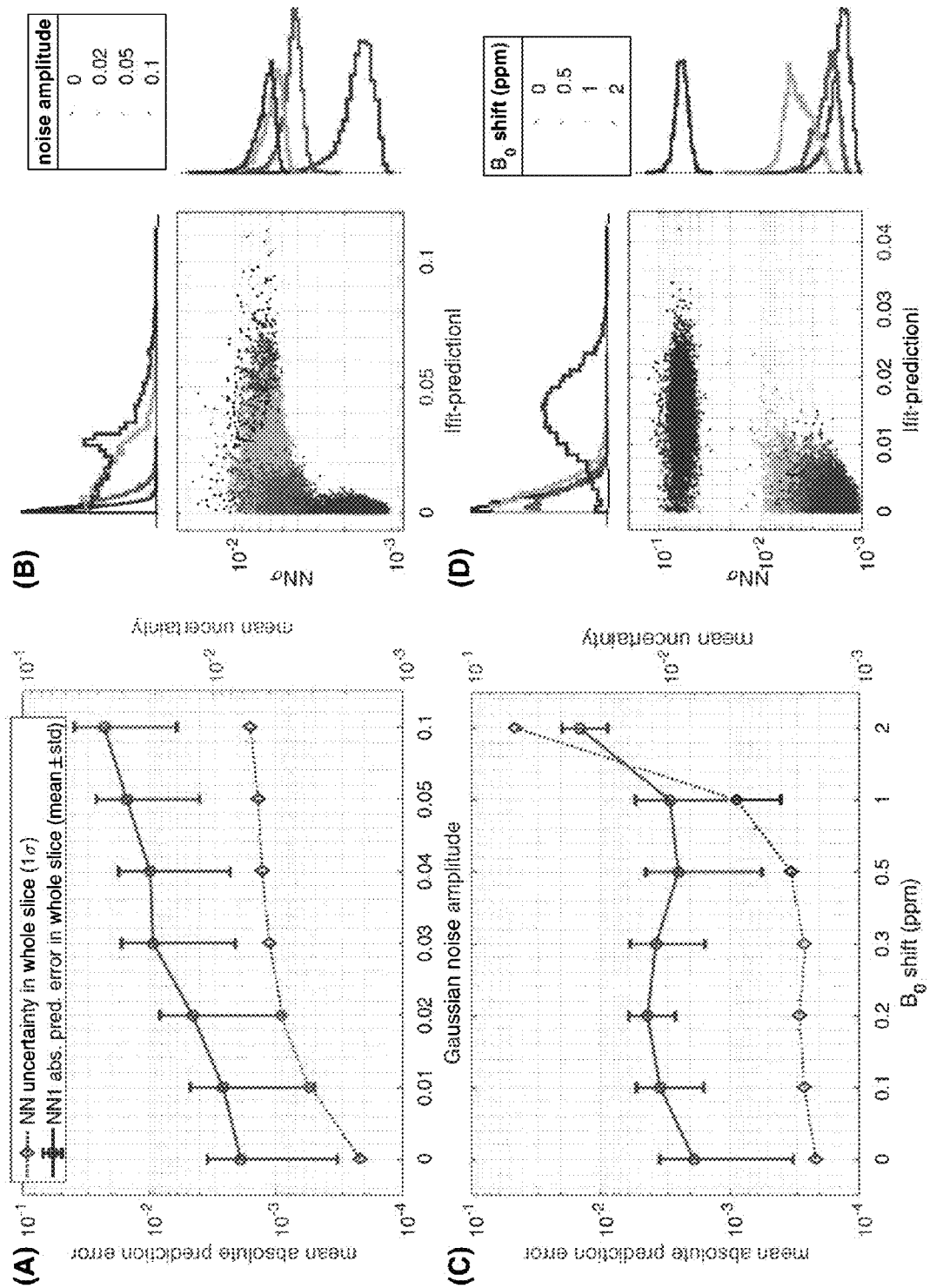

Corruption with Gaussian noise leads to noise in the APT pool amplitude obtained by the least squares fit (FIG. 6D), whereas NN1 prediction (FIG. 6E) results in a smoother parameter map. FIG. 6F shows the corresponding deviations between fit and neural network predictions. In case of additional B0 shifts, the fit results are weakly affected (FIG. 6I) as the fit model with CEST peak positions being defined relatively to the water peak is able to incorporate shifts along the frequency axis. In contrast, NN predictions show significant deviations for additional B0 shifts>1 ppm (FIG. 6J), which were not covered by the distribution of training targets. Such failure of neural network predictions is problematic, as it might not be recognized in cases where no ground truth data is available. However, the uncertainty quantification introduced by the presented network allows to recognize such prediction errors:

FIGS. 6G and 6L show that for both types of input perturbation, uncertainty estimations increase strongly with increasing perturbation strength, directly indicating contrast changes that should not be trusted. This can be seen quantitatively in FIG. 7 illustrating the effect of input perturbation on NN1 outputs and uncertainty estimations. Perturbations of each strength were applied to copies of the entire slice of the test data set shown in FIG. 6. FIG. 7A shows a mean prediction error (dark) and NN uncertainty (grey) across the whole slice for different noise amplitudes between 1% and 10%. Error bars correspond to SD of prediction error across all voxels in the slice. FIG. 7B is a scatter plot of absolute prediction error versus logarithm of NN uncertainty and marginal distributions for some of the investigated noise amplitudes (indicated by grey scale values). FIG. 7C shows the mean prediction error (dark) and NN uncertainty (grey) across the whole slice for different additional B0 shifts between 0.1 ppm and 2 ppm. Error bars correspond to SD of prediction error across all voxels in the slice. FIG. 7D is a scatter plot of absolute prediction error versus logarithm of NN uncertainty and marginal distributions for some of the investigated B0 shifts (indicated by grey scale values).

For input perturbation with Gaussian noise, mean uncertainty estimations across the whole slice (FIG. 7A, grey curve) increase by a factor of about 3 for noise amplitudes above 2%. This reflects the larger SDs of prediction errors (FIG. 7A, dark curve) induced by the input noise. A voxel-wise scatter plot of uncertainty versus prediction error (FIG. 7B) reveals that the uncertainty estimation allows to separate corrupted from uncorrupted voxels, because the corresponding distributions have only a small overlap. In case of additional B0 shifts, prediction errors (FIG. 7C, dark curve) are weakly affected by B0 shifts up to 1 ppm. Still, for shifts of 1 ppm, the mean uncertainty across the slice (FIG. 5C, grey curve) increases by a factor of about 3 compared to the unperturbed case. This can also be seen in FIG. 7D, as the point cloud and histogram for a shift of 1 ppm deviates from the ones corresponding to lower shifts. For a strong B0 shift of 2 ppm, there is a large prediction error together with an increase of uncertainty estimation by 2 orders of magnitude. As the training data set covers a range of B0 shifts of approximately ±1 ppm, this indicates that the network extrapolates for B0 shifts beyond that range. The point clouds in FIG. 7D show that the uncertainty estimation allows to separate these "out-of-training-data" input voxels from the ones within the trained range. Accordingly, the desired feature of uncertainty quantification—recognizing corrupted and "out-of-training-data" inputs—is clearly shown by these results.

Figure 8:
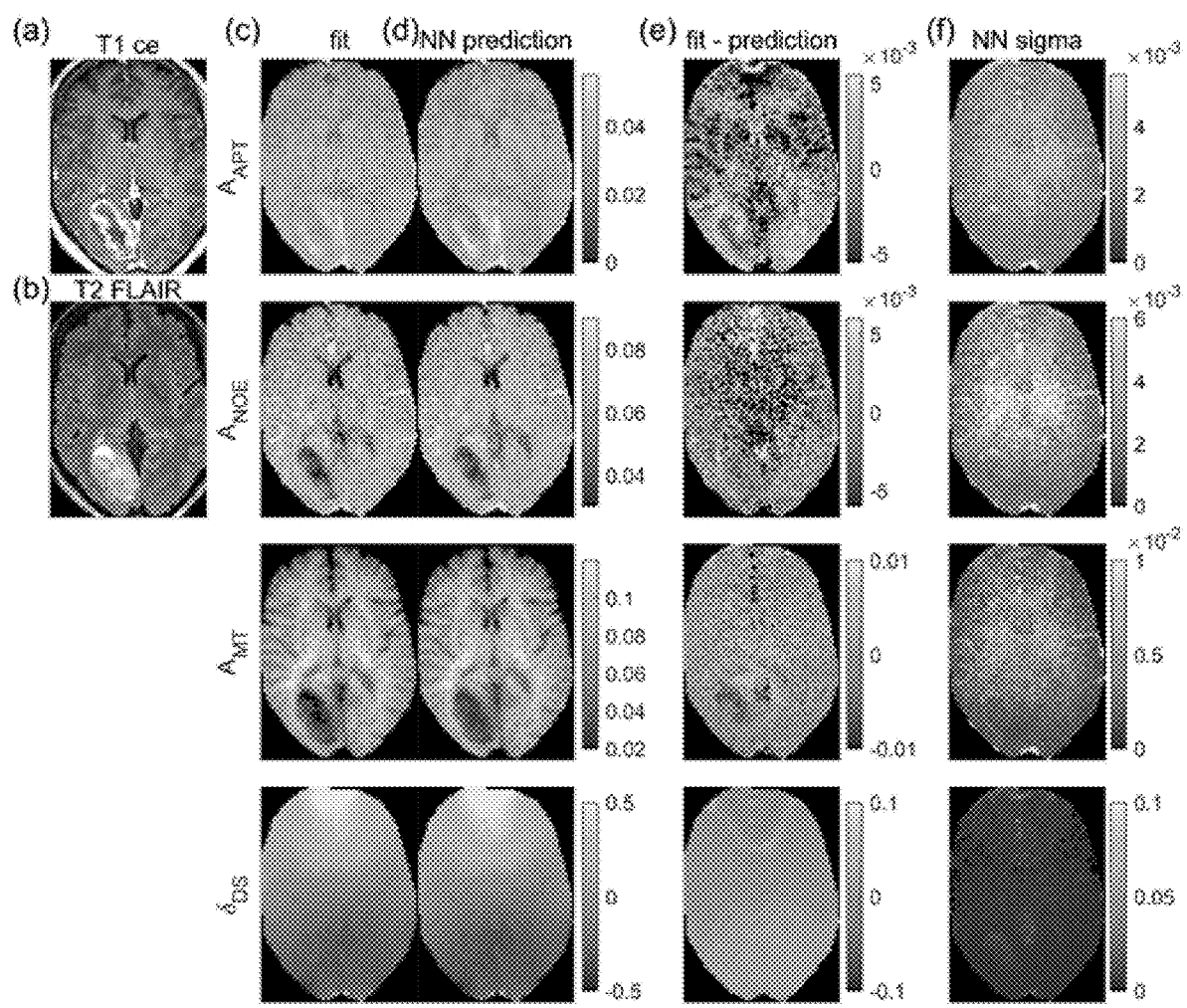

FIG. 8 illustrates the application of the network NN1 (i. e. augmentation with both noise and B0) for analysis of MR data of a brain tumor patient. FIGS. 8A and 8B show the clinical contrasts T1ce (A) and T2 FLAIR (B). FIG. 8C includes the maps obtained by fit results, while FIG. 8D shows the NN1 prediction and FIG. 8E shows the difference between fit and NN1 prediction. The NN1 uncertainty map created according to the invention is illustrated in FIG. 8F. The NN prediction (FIG. 8D) shows similar contrasts as the fit (FIG. 8E), with hyperintensity in the tumor area for the APT map. Scatter plots and Bland-Altmann plots (not shown) comparing fit and NN1 prediction have confirmed that predictions in the tumor patient data set closely match fit results (Pearson correlation>0.87 for all parameters) and exhibit small bias and few outliers. Therefore, the trained network is able to generalize to tumor Z-spectra.

FIG. 8 additionally illustrates that also parts of the tumor area showed slightly larger uncertainty predictions, especially the T2 FLAIR hyper-intense region (FIG. 8B). This reflects the fact that exactly such Z-spectra were not in the training data set nor can be generated as a superposition of healthy data. This can be solved by adding patient data to the training data, preferably including data of different tumor types or other diseases to enable correct prediction and uncertainty quantification.

Figure 9:
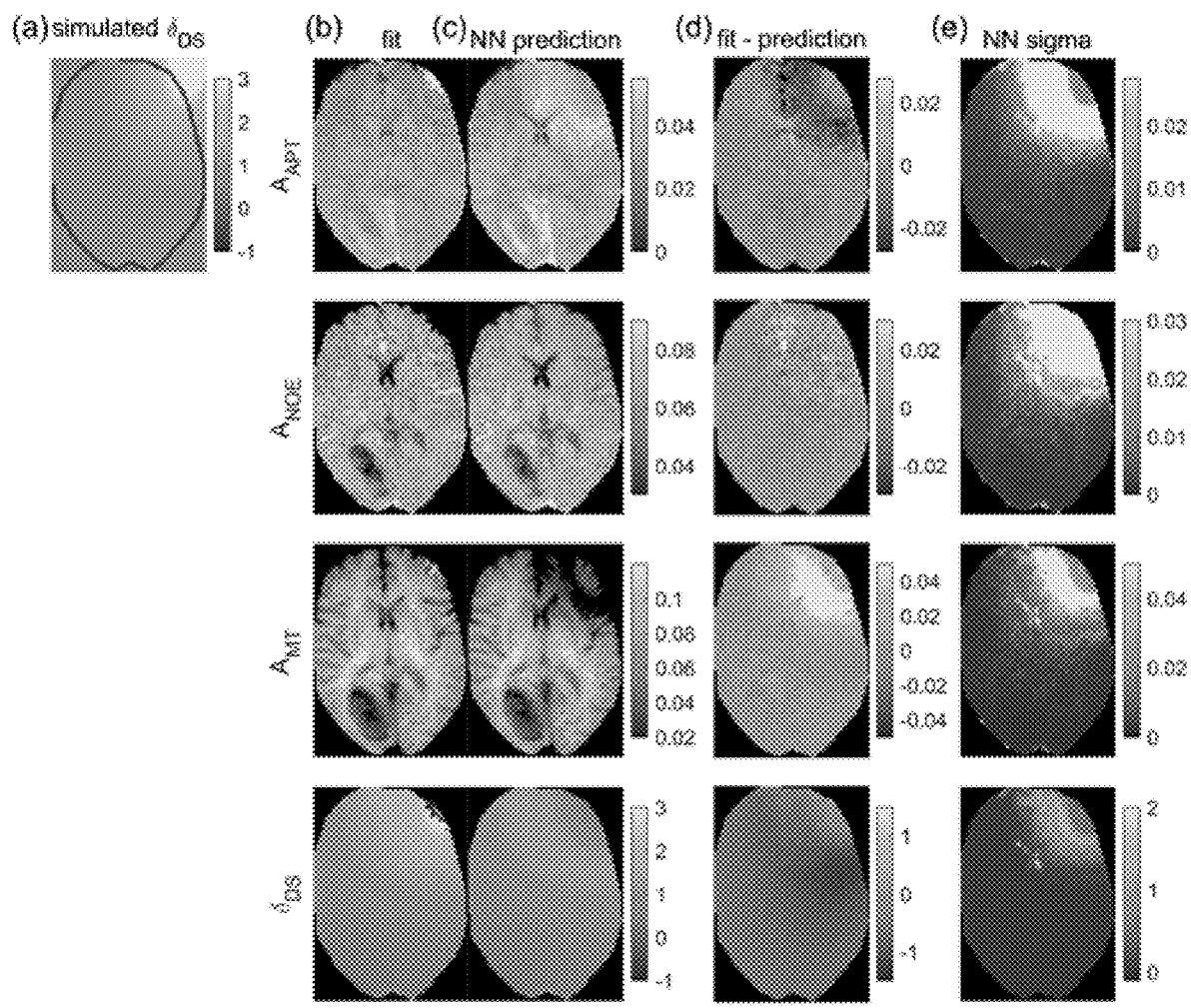

As a further test of the uncertainty quantification, the inventors created a more realistic case compared to FIG. 6: an implant-like B0 artifact caused by a magnetic dipole field originating from a source in the tumor patient's skull was simulated, as illustrated in FIG. 9. ith more details, FIG. 9 shows the performance of network NN1 for simulation of the implant-like B0 artifact, wherein FIG. 9A shows the relative B0 shift simulated by placing a magnetic dipole (in-plane orientation) in the upper right corner of the displayed slice (the dipole field strength is scaled such that it results in a B0 shift of 1 ppm in the center of the slice), FIG. 9B shows conventional fit results, FIG. 9C) shows maps of NN predictions, FIG. 9D shows maps of prediction errors, and FIG. 9E shows the uncertainty estimations for the simulated implant artifact corrupted data set.

The effect of the input data perturbation on least squares fit, NN1 prediction and uncertainty estimation, as shown in FIG. 9, is clearly proved by strongly increased uncertainties (FIG. 9E) indicating failure of the prediction (FIG. 9D) close to the dipole location, where the strongest field inhomogeneity occurs. Therefore, contrast that might arise from or is depleted by the B0 artifact can be identified and therefore not be misinterpreted by applying the inventive MR data processing.

The above results show that the trained networks are able to generate CEST contrasts from uncorrected Z-spectra fast (evaluation time about 1 s for 3D stacks of about 50.000 Z-spectra as opposed to about 10 min in case of Lorentzian fitting) and accurately (Pearson correlation coefficient above 0.9 with respect to Lorentzian fitting), and they allow a generalized application with data that was not included in training. In addition, the network generalizes to tumor data, even if trained only on healthy subject data sets. Particularly, it preserves the APT contrast that has been shown previously to correlate with gadolinium ring enhancement,[1, 34], as also shown with the present results. A similar deep neural network has been shown previously [18] to be able to map from Z-spectra acquired at 3T to Lorentzian fit parameters obtained at 9.4T by training on data sets that have been generated from subjects scanned at both field strengths. Also in that approach, a network trained only with healthy subject data sets was shown to generalize to unseen tumor patient data sets. This agrees with the results shown in FIG. 7, where it could be observed that NN1 neither produced strongly deviating predictions nor clearly increased uncertainties also in the tumor region. In [18], it was argued to be plausible that certain spectra in a tumor area can be described as a combination of spectral features occurring in healthy tissue. Because of that, networks operating only in spectral, but not spatial, domain were argued to generalize also to tumor spectra as long as they can be expressed as non-linear combinations of healthy spectra. NN1 shows denoising capability (FIG. 6C), which was also observed in previous work [18].

It is to be noted that ground truth data itself is generated by least squares Lorentzian fitting. This is important, because the current Lorentzian fitting is also known to be a simplified model, not including the super-Lorentzian line shape [35] and only few of the known CEST pools [36]. This was recently shown to fit the data well at low saturation powers [29]. Moreover, as both the present input and target data was not B1-corrected, deviations between different subjects can be observed. The neural network learns the same connection for differently saturated input and target data. Advantageously, the variations between subjects obtained by the Lorentzian fitting was perfectly reflected by the neural network prediction, which again indicates that the neural network simply follows the provided input and target data and perfectly mimics the least squares fit. In principle, a more sophisticated Bloch model including the saturation power might be able to overcome such issues. Otherwise, a B1 correction solution as suggested at 3T by Goerke et al [27] might improve input and target data, and therefore also the neural network performance and reproducibility.

With any model that is fitted using least squares, targets may suffer from instabilities caused by low SNR and de pendence on initial and boundary values. Some of these issues were previously addressed by the so called IDEAL approach [37] that harnesses the high SNR of spatially downsampled images and minimizes need for choosing appropriate initial values and boundaries. This method is also based on multi-pool Lorentzians for evaluation of low power CEST and has been shown to be superior to conventional fitting. However, being an iterative process, it is still slow (above 100 s for 96×96 2D image) compared to a neural network prediction. Moreover, tissue interfaces and partial volume effects can affect the spatial resolution. For both approaches, IDEAL and the presented neural networks, it is true that the methods are independent of the actual Z-spectrum model and insights gained herein will translate to more sophisticated models such as Bloch-McConnell fitting. Still, to date, there is no gold standard model for Z-spectra in vivo, and full quantification is not in agreement between research groups [3, 7, 38]. Therefore, the current approach used Lorentzian fits to proof the concept of a shortcut calculation including uncertainty quantification but can always be extended to an improved Z-spectrum model once it is found. Moreover, also more general targets that are not generated by a fit can be used with the present invention.

The main extension of the networks presented here compared to similar approaches is the probabilistic output layer. Preferably, it makes use of a log-likelihood loss function that allows the interpretation of network predictions as Gaussian probability distributions and by that enables uncertainty estimation. This probabilistic output layer constitutes an advantageous way of enabling uncertainty estimation for deep learning approaches like the prediction of 9.4T contrasts from 3T Z-spectra [18] or reconstruction of MR fingerprinting data [39], a technique that has also found applications in CEST [38]. Although for the networks investigated here, the predicted parameters were in very good agreement with the conventional method right away, an uncertainty quantification that accurately reflects expected prediction errors required training data augmentation.

The inventors compared the results for both types of input perturbation (noise and B0 shifts), investigated in an exemplary manner for the non-augmented NN0 and augmented NN1. The pre-dictions of both networks have been found in good agreement. Even in case of input noise, when NN0 predicts noisier maps compared to NN1, the uncertainty quantification certainly is improved by data augmentation. The non-augmented NN0 may not accurately reflect prediction errors in all voxels, as there are voxels with high error but low uncertainty. However, compared to that, the augmented NN1 has been found to react to input noise by increasing uncertainties in all corrupted voxels. NN0 pre-dictions exhibit insensitivity up to B0 shifts of 0.5 ppm, with uncertainty estimation increasing by a factor of about 10 for inputs exceeding this range. This corresponds to the range of B0 shifts encountered during training of the NN0. It has been found that training data augmentation reduces this prediction error and leads to a less increased uncertainty, as input B0 shifts of 1 ppm are better supported by training data of NN1.

In summary, the inventors have demonstrated with the example results that deep neural networks can be used to learn the mapping from raw Z-spectra to multi-pool Lorentzian parameters obtained by non-linear least squares fitting, providing a shortcut to the conventional evaluation method at 3T. As a significant extension to previously investigated deep learning approaches in this field, the inventive network architecture enables uncertainty estimation that clearly displays if predictions can be used with confidence or not. After training, the networks yield robust contrast and uncertainty maps in seconds, even in the case of B0 artifacts and/or in the presence of noise. This is promising for fast online reconstruction, bringing sophisticated spectrally selective MR contrasts a step closer to clinical application.

The features of the invention disclosed in the above description, the drawings and the claims can be of significance both individually as well as in combination or sub-combination for the realization of the invention in its various embodiments. The invention is not restricted to the preferred embodiments described above. Rather a plurality of variants and derivatives is possible which also use the inventive concept and therefore fall within the scope of protection. In addition, the invention also claims protection for the subject and features of the subclaims independently of the features and claims to which they refer.

What is claimed is:

1. A method of processing magnetic resonance (MR) data of a sample under investigation, comprising the steps of
   provision of the MR data being collected with an MRI scanner apparatus, and
   machine learning based data analysis of the MR data by supplying the MR data to an artificial neural network being trained with predetermined training data, wherein
   at least one image parameter of the sample and additionally at least one uncertainty quantification measure representing a prediction error of the at least one image parameter are provided by output elements of the neural network, wherein
   the at least one image parameter of the sample comprises at least one CEST parameter, including Z-spectra modelled by Multi-Lorentzian regression, Henkelman-based water, MT and CEST pool regression of effect strength, proton pool sizes and exchange and relaxation rates, a pH map derived from CEST data or 31P spectroscopy data, a pseudo-PET map derived from multi-modal MRI and CEST MRI, a pseudo-CT map derived from multi-modal MRI, or a histology parameter map.

2. The method according to claim 1, wherein
   the data analysis creates a parameter map of the at least one image parameter of the sample, and
   the at least one uncertainty quantification measure comprises an uncertainty map of an uncertainty quantity of the at least one image parameter.

3. The method according to claim 1, wherein
   the training data of the neural network are provided by a training with a Gaussian negative log-likelihood loss function.

4. The method according to claim 1, wherein
   the training data of the neural network are provided by training data augmentation.

5. The method according to claim 4, wherein
   the training data of the neural network are provided by the training data augmentation with at least one of simulated Gaussian noise in inputs, simulated $B_0$ shifts and implant-like $B_0$-artifacts.

6. The method according to claim 1, including a step of evaluating the at least one uncertainty quantification measure.

7. The method according to claim 6, further including
   providing at least one semantic statement on the collection of the MR data, wherein the at least one semantic statement includes at least one of a confirmation of a successful collection of the MR data, a request for a repetition of the MR data, an indication of a system error influencing the collection of the MR data, an indication of a movement artefact influencing the collection of the MR data, an indication of an implant artefact influencing the collection of the MR data and a provision of a warning signal.

8. The method according to claim 6, further including recognizing a general noise level of the MR data.

9. The method according to claim 6, further including recognizing corrupted MR data.

10. The method according to claim 1, wherein
    the step of subjecting the MR data to the machine learning based data analysis is included in an operation of the MRI scanner apparatus.

11. The method according to claim 1, wherein
    the step of subjecting the MR data to the machine learning based data analysis is conducted separately from an operation of the MRI scanner apparatus.

12. A magnetic resonance imaging (MRI) scanner apparatus, comprising
    an MRI scanner signal acquisition device, being arranged for collecting MR data, and
    a data processing unit that is configured for subjecting the MR data to a machine learning based data analysis with a neural network being trained with predetermined training data, wherein
    the data processing unit is configured for creating at least one image parameter of the sample and for additionally creating at least one uncertainty quantification measure representing a prediction error of the at least one image parameter, wherein the at least one image parameter of the sample comprises at least one CEST parameter, including Z-spectra modelled by Multi-Lorentzian regression, Henkelman-based water, MT and CEST pool regression of effect strength, proton pool sizes and exchange and relaxation rates, a pH map derived from CEST data or 31P spectroscopy data, a pseudo-PET map derived from multi-modal MRI and CEST MRI, a pseudo-CT map derived from multi-modal MRI, or a histology parameter map.

13. A non-transitory computer-readable medium storing instructions which, when executed on a computer, carry out the method according to claim 1.

14. An apparatus comprising a computer-readable storage medium containing program instructions which, when executed on a computer, carry out the method according to claim 1.

* * * * *